United States Patent
Wang et al.

(10) Patent No.: US 9,673,622 B2
(45) Date of Patent: Jun. 6, 2017

(54) POWER SUPPLYING SYSTEM, LINEAR CONTROLLING MODULE THEREOF, AND CONTROLLING METHOD OF SWITCHING COMPONENT

(71) Applicant: Chicony Power Technology Co., Ltd., New Taipei (TW)

(72) Inventors: Tzu-Hung Wang, New Taipei (TW); Chen-Hsiung Lee, New Taipei (TW); Chang-Cheng Hsiao, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 247 days.

(21) Appl. No.: 14/444,132

(22) Filed: Jul. 28, 2014

(65) Prior Publication Data
US 2016/0028322 A1    Jan. 28, 2016

(51) Int. Cl.
  G06F 1/00   (2006.01)
  G06F 1/26   (2006.01)
  H02J 1/00   (2006.01)
  H03K 17/16  (2006.01)
  G06F 1/30   (2006.01)

(52) U.S. Cl.
  CPC .............. *H02J 1/00* (2013.01); *G06F 1/305* (2013.01); *H03K 17/162* (2013.01); *H03K 2217/0036* (2013.01); *H03K 2217/0054* (2013.01)

(58) Field of Classification Search
  CPC .......... H02J 1/00; G06F 1/305; H03K 17/162; H03K 2217/0036; H03K 2217/0054
  USPC .................... 713/323, 300; 323/318
  See application file for complete search history.

(56) References Cited

U.S. PATENT DOCUMENTS

| | | | | |
|---|---|---|---|---|
| 6,552,445 B1 * | 4/2003 | Yang | ...................... | G06F 1/1616 307/140 |
| 2004/0114401 A1 * | 6/2004 | De Anna | ................. | H02M 1/34 363/56.12 |
| 2008/0002509 A1 * | 1/2008 | You | ........................... | G06F 1/26 365/230.05 |
| 2014/0176017 A1 * | 6/2014 | Kuang | ............... | H05B 33/0815 315/307 |

FOREIGN PATENT DOCUMENTS

| | | | |
|---|---|---|---|
| JP | 2011083043 A | 4/2011 |
| TW | 477144 B | 2/2002 |
| TW | 200742971 | 5/2006 |
| TW | I409622 B1 | 9/2013 |

* cited by examiner

*Primary Examiner* — Ji H Bae
(74) *Attorney, Agent, or Firm* — Muncy, Geissler, Olds & Lowe, P.C.

(57) ABSTRACT

The linear controlling module of the present invention includes a controlling switch, a first resistor, a capacitor, and a second resistor. The controlling switch is electrically connected to a controlling signal outputting terminal of a power supplying device, the first resistor is electrically connected to the controlling switch, the capacitor is electrically connected to a electric power outputting terminal of the power supplying device and the first resistor, and the second resistor is electrically connected to the switch component of the power supplying device, the first resistor, and the capacitor. The switch component is electrically connected to an electric power outputting terminal.

12 Claims, 7 Drawing Sheets

US 9,673,622 B2

POWER SUPPLYING SYSTEM, LINEAR CONTROLLING MODULE THEREOF, AND CONTROLLING METHOD OF SWITCHING COMPONENT

BACKGROUND OF THE INVENTION

Field of the Invention

The present invention relates to a power supplying system, and in particular to an power supplying system with low standby power consumption.

Description of Related Art

Reference is made to FIG. 1, which is a circuit diagram of a related art switch-controlling circuit. The switch-controlling circuit 1 is electrically connected to a direct current (DC) power source VDC and a switching component 10. The switching controlling circuit 1 is configured to control conduction of the switching component 54 so as to decide whether or not the DC power source conduct to an electronic system PS. The electronic system PS is electrically connected to the drain terminal of the switching component 10 via outputting resistor Ro1 and Ro2, and the nodes electrically connected between the electronic system PS and the outputting resistor Ro1 and Ro2 are respectively defined as power outputting terminal Vo1 and Vo2.

The switch-controlling circuit 1 includes a sensing resistor RS, a controlling switch Q, a resistor R, and a capacitor C. One terminal of the sensing resistor RS is electrically connected to the DC power source VDC and the source terminal of the switching component 10, and the other terminal of the sensing resistor RS is electrically connected to the drain terminal of the controlling switch Q and the gate terminal of the switching component 10. The source terminal of the controlling switch Q is electrically connected to the ground, and the gate terminal thereof is electrically connected to a controlling-signal outputting terminal Sin. One terminal of the resistor R is electrically connected to the gate terminal of the controlling switch Q, and the other terminal thereof is electrically connected to the ground. One terminal of the capacitor C is electrically connected to the gate terminal of the controlling switch Q, and the other terminal thereof is electrically connected to the ground. In short, the resistor R and the capacitor C are electrically connected in parallel and are configured to filter noise sent from the controlling-signal outputting terminal Sin.

In the moment of the electronic system PS is activated, the controlling-signal outputting terminal Sin sends a controlling signal to the controlling switch Q to drive the controlling switch Q to conduct (which allowing full current to the sensing resistor RS), and then the switching component 10 conducts. It should be noted that the time difference between the conduction of the controlling switch Q and that of the switching component 10 is quite short, and can be considered that the controlling switch Q and the switching component 10 close at the same time, however which causes the voltage level of the DC power source VDC suddenly dropping, as shown in FIG. 2.

SUMMARY OF THE INVENTION

It is an object of the present invention is to provide a linear controlling module, the linear controlling module is electrically connected to a power supplying device configured to provide a direct current (DC) power source and an electronic system, the linear controlling module is configured to solve a problem of voltage level dropping in the moment of the electronic system is activated.

Accordingly, the present invention provides a linear controlling module. The linear controlling module is electrically connected to a power supplying device including a alternative current (AC) to direct current (DC) power converting module, a switching component, a controlling signal terminal, a main power outputting terminal, and a standby power outputting terminal. The AC to DC power converting module includes an electric power outputting terminal. The switching component is electrically connected to the electric power outputting terminal of the AC to DC power converting module and the main power outputting terminal. The standby power outputting terminal is electrically connected to the electric power outputting terminal of the AC to DC power converting module. The linear controlling module includes a controlling switch, a first resistor, a capacitor, and a second resistor. The controlling switch is electrically connected to the controlling signal outputting terminal, the first resistor is electrically connected to the controlling switch, the capacitor is electrically connected to the electric power outputting terminal of the AC to DC power converting module and the first resistor. The second resistor is electrically connected to the electric power outputting terminal of the AC to DC power converting module, the switching component, the first resistor, and the capacitor.

As the result, the switching component can linearly conduction in a moment of an electronic system electrically connected to the power supplying device is activated to prevent the voltage outputted from the electric power outputting terminal from suddenly dropping.

In an embodiment of the present invention, the linear controlling module further includes a discharge circuit electrically connected to the electric power outputting terminal of the AC to DC power converting module, the controlling signal outputting terminal, the capacitor, the first resistor, and the second resistor. The discharge circuit includes a changing component and a third resistor. The changing component is electrically connected to the electric power outputting terminal of the AC to DC power converting module and the signal outputting terminal. The third resistor is electrically connected to the changing component, the first resistor, the capacitor, and the second resistor. The changing component is, for example, a metal-oxide-semiconductor field-effect transistor. The discharging circuit accelerates discharging time of the capacitor, so as to prevent voltage outputted from the electric power outputting terminal from suddenly dropping when the electronic system is activated repeated in a short time.

In an embodiment of the present invention, the linear controlling module further includes a protecting switch electrically connected to the electric power outputting terminal of the AC to DC power converting module, the changing component, and the capacitor. The protecting switch is, for example, a diode. The protecting switch make the capacitor still discharge when the electronic system is short, so that the voltage outputted from the electric power outputting terminal cannot suddenly drop while the short circuit situation of the electronic system is excluded and activated again.

It is another object of the present invention is to provide a power supplying system. The power supplying system is configured to provide an electric power to an electronic system and prevent voltage outputted form an electric power outputting terminal thereof from suddenly dropping in a moment of the electronic system is activated.

Accordingly, the present invention provides a power supplying system. The power supplying system is electrically connected to an AC power supplier and an electronic system. The power supplying system includes an AC to DC power converting module, a switching component, a power manager, a controller, a main power outputting terminal, a standby power outputting terminal, and a linear controlling module. The AC to DC power converting module is electrically connected to the AC power supplier and includes an electric power outputting terminal. The switching component is electrically connected to the electric power outputting terminal. The power manager is electrically connected to the electronic system and the switching component and includes a controlling signal outputting terminal. The controller is electrically connected to the power manager and the AC to DC power converting module. The main power outputting terminal is electrically connected to the switching component and the electronic system. The standby power outputting terminal is electrically connected to the electric power outputting terminal and the electronic system. The linear controlling module includes a controlling switch, a first resistor, a capacitor, and a second resistor. The controlling switch is electrically connected to the controlling signal outputting terminal, the first resistor is electrically connected to the controlling switch, the capacitor is electrically connected to the electric power outputting terminal of the AC to DC power converting terminal and the first resistor. The second resistor is electrically connected to the electric power outputting terminal of the AC to DC power converting module, the switching component, the first resistor, and the capacitor.

Therefore, the switching component can linearly conduction in a moment of the electronic system is activated to prevent the voltage outputted from the electric power outputting terminal from suddenly dropping.

In an embodiment of the present invention, the linear controlling module further includes a discharge circuit electrically connected to the electric power outputting terminal of the AC to DC power converting module, the controlling signal outputting terminal, the capacitor, the first resistor, and the second resistor. The discharge circuit includes a changing component and a third resistor. The changing component is electrically connected to the electric power outputting terminal of the AC to DC power converting module and the signal outputting terminal. The third resistor is electrically connected to the changing component, the first resistor, the capacitor, and the second resistor. The changing component is, for example, a metal-oxide-semiconductor field-effect transistor. The discharging circuit accelerates discharging time of the capacitor, so that to prevent the voltage outputted from the electric power outputting terminal suddenly dropping when the electronic system is activated repeated in a short time.

In an embodiment of the present invention, the linear controlling module further includes a protecting switch electrically connected to the electric power outputting terminal of the AC to DC power converting module, the changing component, and the capacitor. The protecting switch is, for example, a diode. The protecting switch make the capacitor still discharge when the electronic system is short, so that the voltage outputted from the electric power outputting terminal cannot suddenly drop while the short circuit situation of the electronic system is excluded and activated again.

The power supplying system further includes an isolating unit arranged between the power manager and the controller and electrically connected thereto. Besides, the AC to DC power converting module includes an electromagnetic interference filter, a rectifier, and a DC to DC power converter. The electromagnetic interference filter is electrically to the AC power supplier and the rectifier, and the rectifier is electrically connected to the electromagnetic interference filter. The DC to DC power converter is electrically connected to the rectifier, and the DC to DC power converter includes the electric power outputting terminal.

It is still another object of the present invention to provide a controlling method of switching component. The controlling method makes a switching component conduct linearly.

Accordingly, the controlling method of the switching component is applied to linearly conduct a switching component. The switching component is electrically connected to a secondary of a AC to DC power converting module. The AC to DC power converting module comprises a electric power outputting terminal is electrically connected to a standby power outputting terminal, the switching component is electrically connected to the electric power outputting terminal and at least one main power outputting terminal, the switching component determines whether or not to conduct electric power to the main power outputting terminal. The controlling method of the switching component comprises step as following: providing a driving voltage; providing a plurality of pulse width modulation (PWM) signals in sequence; and modulating the duty cycle of the PWM signals from 0% to 100%. The PWM signals making the switching component conduct linearly, and a time of the duty cycle of the PWM signals modulated from 0% to 100% is 20 ms.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
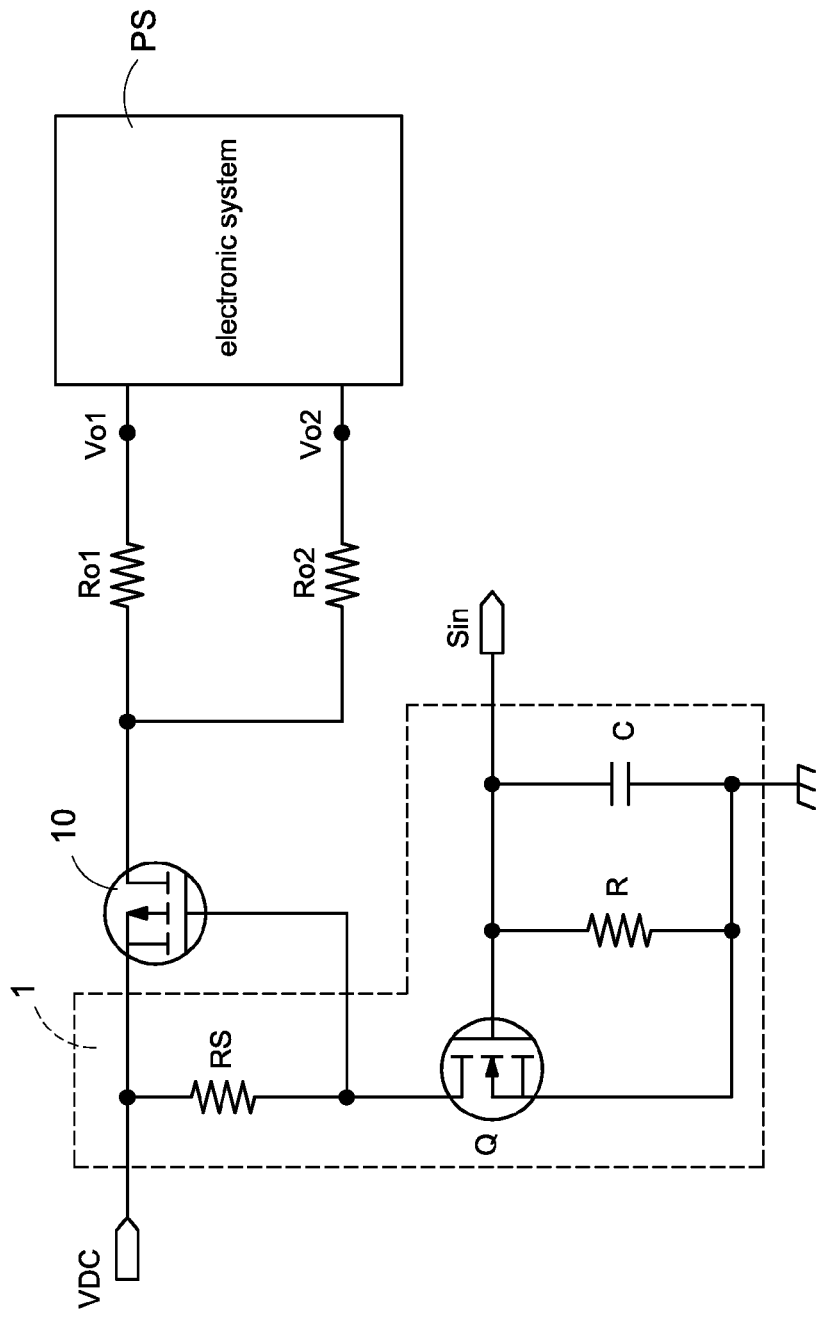
FIG. 1 is a circuit diagram of a related art switch-controlling circuit.
Figure 2:
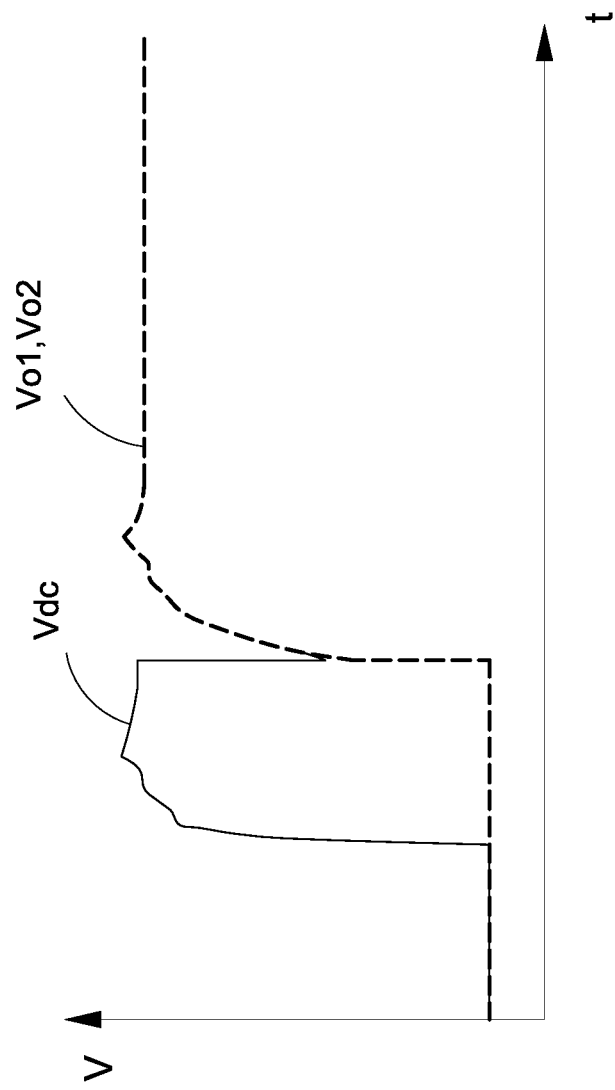
FIG. 2 is a waveform chart illustrating voltage of DC electric power and voltage outputted from the electric power outputting terminal.
Figure 3:
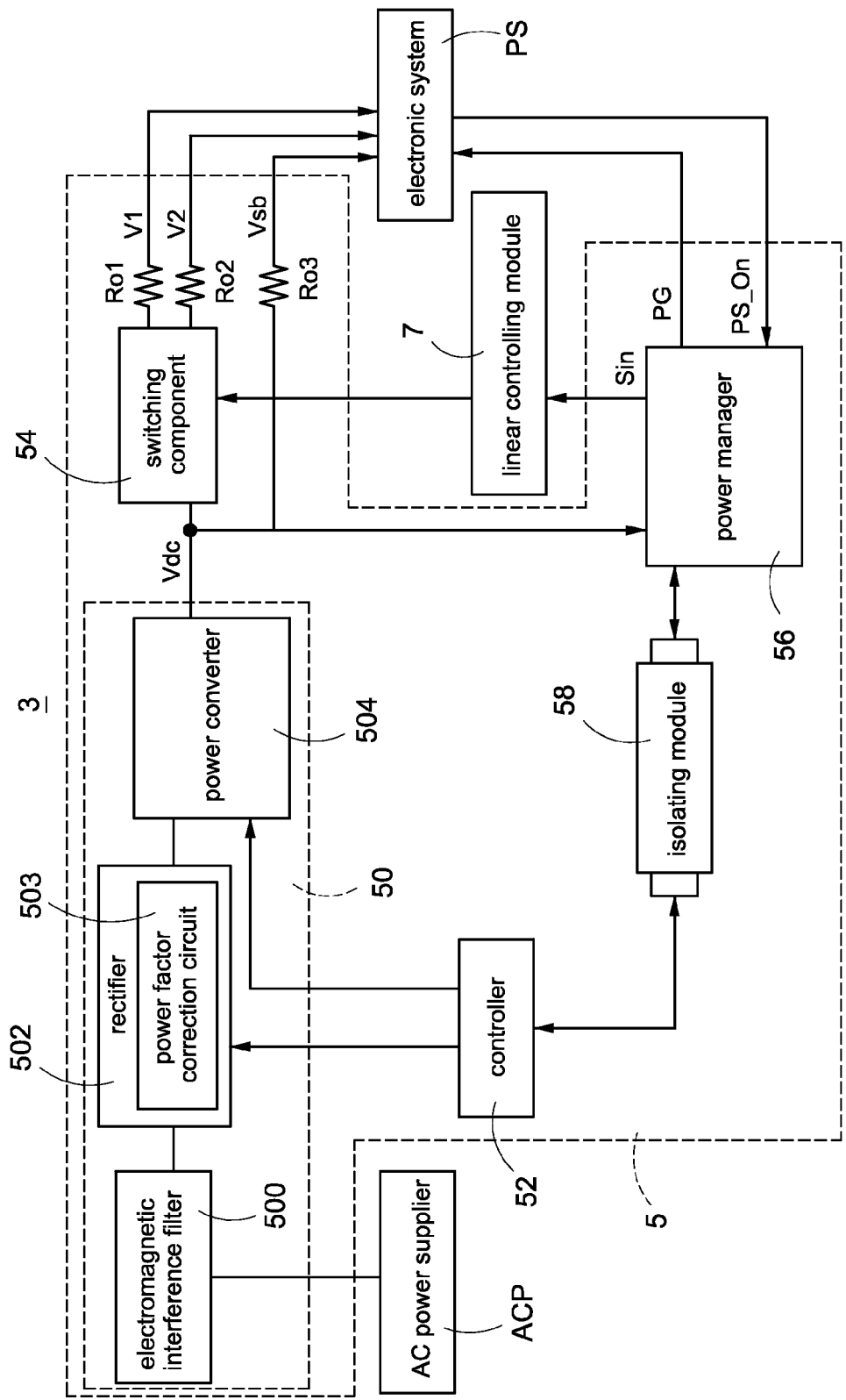
FIG. 3 is a circuit block diagram of a power supplying system according to the present invention.

Reference is made to FIG. 3, which is a circuit block diagram of a power supplying system according to the present invention. The power supplying system 3 includes a power supplying device 5 and a linear controlling module 7. The linear controlling module 7 is configured to control operating state of a switching component 54 of the power supplying device 5.

The power supplying device 5 is arranged between an alternative current (AC) power supplier ACP and an electronic system PS and electrically connected thereto. The power supplying device 5 receives an AC electric power outputted from the AC power supplier ACP and then outputs a converted electric power with power conversion to the electronic system PS.

The power supplying device 5 includes an alternative current (AC) to direct current (DC) power converting module 50, a controller 52, the switch component 54, a power manager 56, an isolating unit 58, a plurality of main power outputting resistor Ro1 and Ro2, at least one main outputting terminal, a standby outputting resistor Ro3, and a standby power outputting terminal Vsb. In this embodiment, the power supplying device 5 includes, for example, two main power outputting terminal V1 and V2.

AC to DC power converting module 50 includes an electromagnetic interference filter 500, a rectifier 502 and a power converter 504. The electromagnetic interference filter 500 is electrically connected to the AC power supplier ACP. The rectifier 502 is electrically connected to the electromagnetic interference filter 500 and the controller 52, and the power converter 504 is electrically connected to the electromagnetic interference filter 500 and the controller 52. The electromagnetic interference filter 500 receives the AC power source outputted from the AC power supplier ACP and filters electromagnetic interference of the AC power source. The rectifier 502 is configured to convert the AC electric power outputted from the electromagnetic interference filter 500 into a direct current (DC) electric power. The rectifier 502 includes a power factor correction circuit 503 for decrease inputting current and boost voltage inputted therein.

The power converter 504 is a DC to DC power converter. The power converter 504 receives the DC electric power outputted from the rectifier 502, modulates the voltage level of the DC electric power, and then outputs the modulated DC electric power from an electric power outputting terminal Vdc. In particularly, the DC to DC power converter 504 can be a boost converter (step-up converter) with an outputting voltage greater than its inputting voltage or a buck converter (step-down converter) with an outputting voltage smaller than its inputting voltage. The power converter 504 is, for example, LLC resonant power converter, dual forward power converter or single forward power converter.

The switch component 54 is electrically connected to the electric power outputting terminal Vdc of the AC to DC power converting module 50. The main outputting resistor Ro1 is electrically connected to the switch component 54 and the main power outputting terminal V1, and the main outputting terminal Ro2 is electrically connected to the switch component 54 and the main power outputting terminal V2. The main power outputting terminal V1 and V2 are electrically connected to the electronic system PS, respectively. The standby outputting resistor Ro3 is electrically connected to the electric power outputting terminal Vdc of the AC to DC power converting module 50 and the standby power outputting terminal Vsb.

It should be noted that the amount of the main power outputting terminal can be one or more, in this embodiment, the power supplying system 3 includes two main power outputting terminal V1 and V2. In the particular application, the amount of the main power outputting terminal can be one or more, and if the amount of the main power outputting terminal changes, the amount of the main outputting resistor must be changes accordingly.

Besides, the voltage outputted from the standby power outputting terminal Vsb can be the same as that outputted from the main power outputting terminal V1 and V2. However, the voltage outputted from the standby power outputting terminal Vsb can be different from that of outputted from the main power outputting terminal V1 and V2. When the voltage outputted from the standby power outputting terminal Vsb can be different from that of outputted from the main power outputting terminal V1 and V2, the power supplying system may include a boost circuit or a buck circuit arranged between the AC to DC power converting module 50 and the standby outputting resistor Ro3 and electrically connected thereto for boosting or bucking voltage outputted from the standby power outputting terminal Vsb.

The power manager 56 is electrically connected to the AC to DC power converting module 50, the electronic system PS, and the isolating unit 58. The power manager 56 includes a signal outputting terminal PG, a signal inputting terminal PS_On, and a controlling signal outputting terminal Sin. The power outputting terminal PG and the signal inputting terminal PS_On are electrically connected to the electronic system PS, respectively. The controlling signal outputting terminal Sin is electrically connected to the linear controlling module 7. The power manager 56 sends signals to the electronic system PS via the signal outputting terminal PG and receives signals sent from the electronic system PS via the signal inputting terminal PS_On.

The linear controlling module 7 is electrically connected to the switching component and the power manager 56. The linear controlling module 7 receives a controlling signal sent from the controlling signal outputting terminal Sin and controls conduction of the switching component 54 to decide whether or not to conduct electric powers to the electronic system PS via the main power outputting terminal V1 and V2 according to the controlling signal.

The isolating unit 58 is electrically connected to the power manager 56 and the controller 52. The isolating unit 58 is not only configured to isolated-transmit signals sent from the power manager 56 to the controller 52 but also configured to isolated-transmit signals sent from the power manager 56 to the controller 52.

When the switching component 54 is non-conducting, the DC electric power outputted from the electric power outputting terminal Vdc of the AC to DC power converting module 50 can conduct to the electronic system PS via the main power outputting terminal V1 and V2. On the contrary, when the switching component 54 is conducting, the DC electric power outputted from the electric power outputting terminal Vdc of the AC to DC power converting module 50 can conduct to the electronic system PS via the main power outputting terminal V1 and V2. Besides, the standby power outputting terminal Vsb conducts electric power to the electronic system PS not only when the switching component 54 is conducting but also when the switching component 54 is non-conducting.

Figure 4:
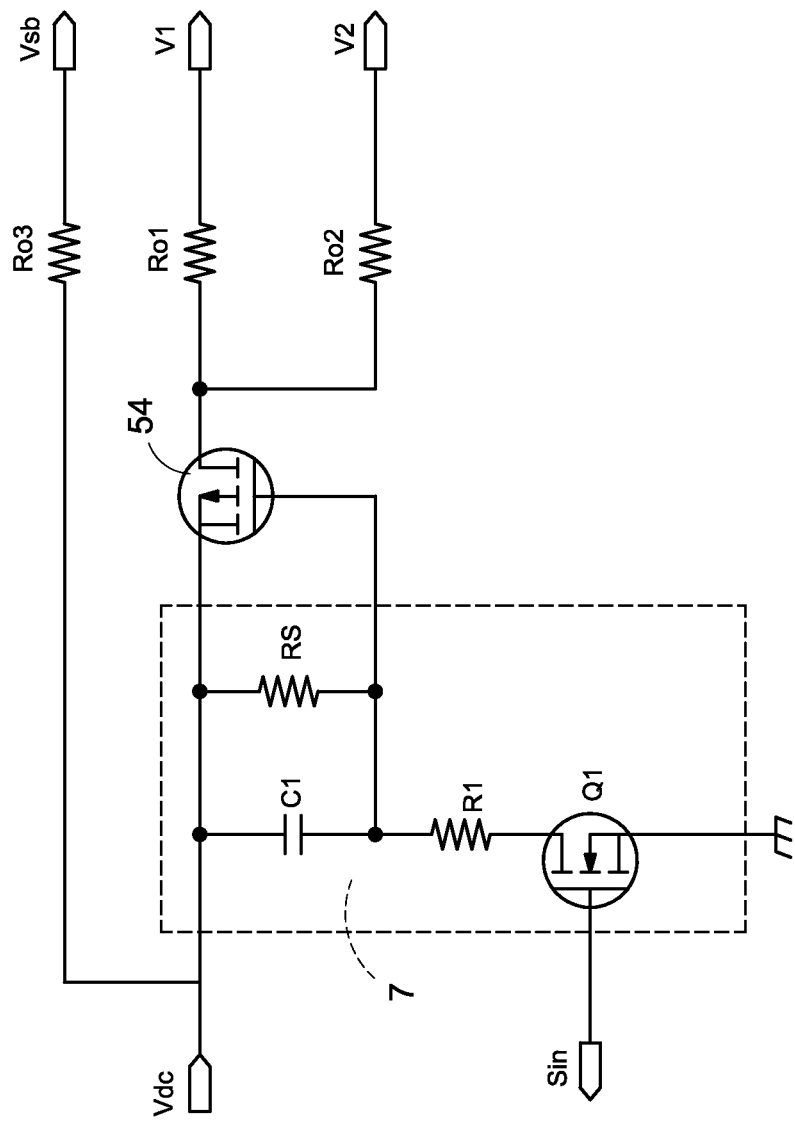
FIG. 4 is a circuit diagram of a linear controlling module according to a first embodiment of the present invention.

Reference is made to FIG. 4, which is a circuit diagram of the linear controlling module according to a first embodiment of the present invention. For convenience, FIG. 4 also shows the switching component 54, the main outputting resistor Ro1 and Ro2, main power outputting terminal V1 and V2, the standby power outputting terminal Vsb, the standby outputting resistor Ro3, the electric power outputting terminal Vdc of the AC to DC power converting module 50, and the controlling signal outputting terminal Sin of the power manager 56. In this embodiment, the switching component 54 is, for example, a P-type metal-oxide-semiconductor field-effect transistor (MOSFET).

The linear controlling module 7 includes a controlling switch Q1, a first resistor R1, a capacitor C1, and a second resistor RS. The controlling switch Q1 is electrically connected to the controlling signal outputting terminal Sin, the first resistor R1 is electrically connected to the controlling switch Q1, the capacitor C1 is electrically connected to the electric power outputting terminal Vdc of the AC to DC power converting module 50 and the switching component 54. The second resistor RS is electrically connected to the capacitor C1, the first resistor R1, and the switching component 54. In particular, the second resistor RS is electrically connected to the capacitor C1 in parallel.

In this embodiment, the controlling switch Q1 is, for example, an N-type MOSFET with gate, grain, and source terminals. The gate terminal of the controlling switch Q1 is electrically connected to the controlling signal outputting terminal Sin, the drain terminal thereof is electrically connected to the first resistor R1, and the source thereof is electrically connected to ground. However, in the particular applications, the controlling switch Q1 may be other electromechanical device with switching function.

With refer again to FIG. 3 and FIG. 4, when the electronic system PS is activated, the signal inputting terminal PS_On of the power manager 56 receives an active signal sent from the electronic system PS. After that, the controlling signal outputting terminal Sin of the power manager 56 sends a controlling signal to the controlling switch Q1 of the linear controlling module 7 for driving the controlling switch Q1 to conduct. While the controlling switch Q1 conducts, the capacitor C1 begins charging, and the voltage between the gate and source terminals of the switching component 54 increases. The first resistor R1 and the second resistor R2 collectively construct a division circuit, and by appropriately selecting the resistances of the first resistor R1 and the second resistor R2, the voltage between the gate and the source terminals of the switching component 54 can be effectively controlled. As the result, the conduction of the switching component 54 can be well controlled and prevent the switching component 54 from overvoltage damaging. The main power outputting terminal V1 and V2 respectively output electric power to the electronic system PS when the switching component 54 is conducting.

The capacitor C1, the first resistor R1, and the second resistor R2 electrically connected to the switching component 54 make rate of voltage between the source and gate terminals of the switching component 54 rises smoothly and linearly, which prevent the switching component 54 conducts in a moment of the electronic system PS is activated. As the result, the voltage outputted from the electric power outputting terminal Vdc cannot suddenly drop in a moment the electronic system PS is activated.

Figure 6:
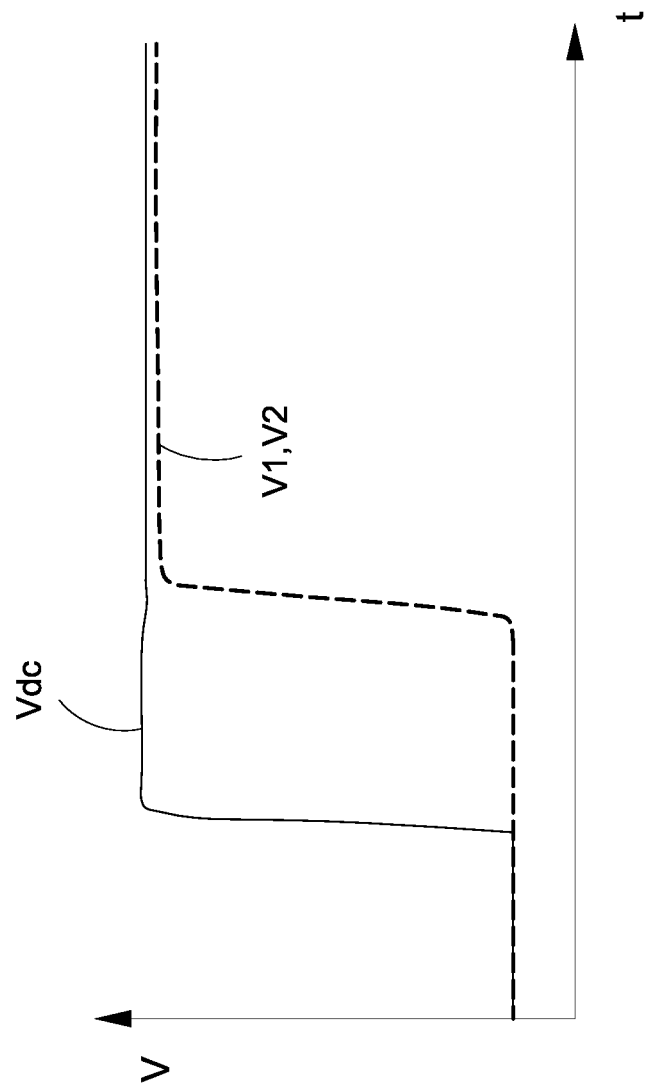
FIG. 6 is a waveform chart illustrating voltages outputted from the electric power outputting terminal and the main power outputting terminal.

Reference is made to FIG. 6, solid line illustrates the voltage outputted from the electric power outputting terminal Vdc, and the dashed line illustrates the voltage outputted from the main power outputting terminal V1 and V2. As shown in FIG. 6, the voltage outputted from the electric power outputting terminal Vdc does not drop in a moment of the electronic system PS is activated, which can avoid the power supplying system 3 from malfunction and increase stability thereof. Therefore, the linear controlling module 7 can effectively prevent the voltage outputted from the electric power outputting terminal Vdc from dropping at a moment of the electronic system PS is activated.

On the contrary, when the electronic system PS is inactivated (namely the electronic system PS operates in standby mode), a controlling signal has sent form the controlling signal outputting terminal Sin of the power manager 56 and receives the linear controlling module 7 drives the controlling switch Q1 to non-conduct. The switching component 54 non-conducts while the controlling switching Q1 non-conducts, and the electric power outputted from the electric power outputting terminal Vdc cannot be conducted to the electronic system PS via the main power outputting terminal V1 and V2. However, electric power outputted from the electric power outputting terminal Vdc is conducted to the electronic system PS via the standby power outputting terminal Vsb.

In short, when the electronic system PS is inactivated, the electric power outputted from the electric power outputting terminal Vdc cannot be conducted to the electronic system PS via the main power outputting terminal V1 and V2, however the electric power outputted from the electric power outputting terminal Vdc can be conducted to the electronic system PS via the standby power outputting terminal Vsb. As the result, the power supplying system 3 achieves power-saving when the electronic system PS is inactivated.

Figure 5:
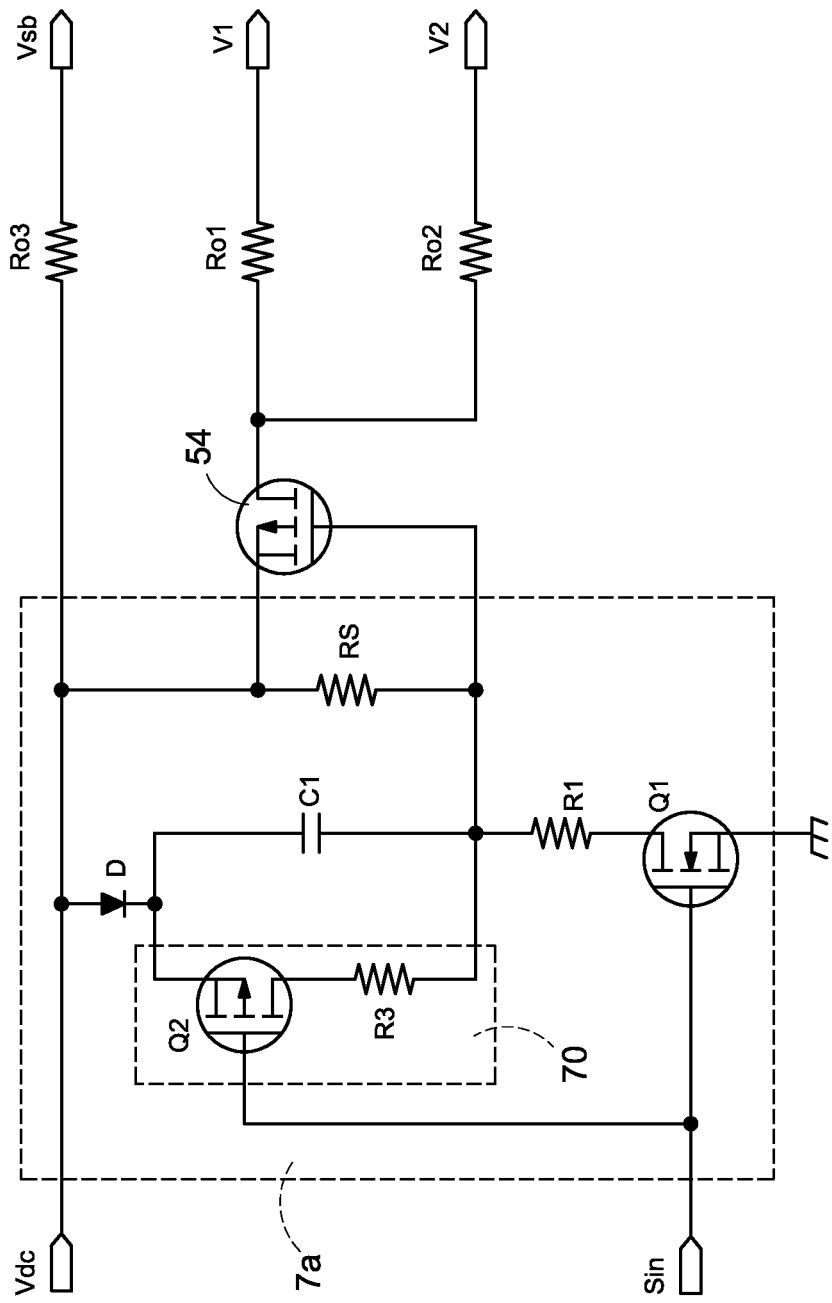
FIG. 5 is a circuit diagram of a linear controlling module according to a second embodiment of the present invention.

Reference is made to FIG. 5, which is a circuit diagram of a linear controlling module according to a second embodiment of the present invention. For convenience, FIG. 5 also shows the switching component 54, the main outputting resistor Ro1 and Ro2, main power outputting terminal V1 and V2, the standby power outputting terminal Vsb, the standby outputting resistor Ro3, the electric power outputting terminal Vdc of the AC to DC power converting module 50, and the controlling signal outputting terminal Sin of the power manager 56.

The linear controlling module 7a is similar to the linear controlling module 7 mentioned in the first embodiment, and the same reference numbers are used in the drawings and the description to refer to the same parts. It should be noted that the linear controlling module 7a shown in FIG. 5 further includes a discharging circuit 70.

The discharging circuit 70 is electrically connected to the electric power outputting terminal Vdc, the controlling signal outputting terminal Sin, the capacitor C1, and the first resistor R1. The discharging circuit 70 is configured to be a discharging path of the capacitor C1.

The discharging circuit 70 includes a changing component Q2 and a third resistor R3. The changing component Q2 is electrically connected to the electric power outputting terminal Vdc of the AC to DC power converting module 50, the controlling signal outputting terminal Sin, and the controlling switch Q1. The third resistor R3 is electrically connected to the controlling switch Q1, the first resistor R1, the second resistor RS, and the capacitor C1. In this embodiment, the switching component Q2 is a MOSFET with gate, grain, and source terminal. The gate terminal of the switching component Q2 id electrically connected to the controlling signal outputting terminal Sin and the controlling switch Q1, the source thereof is electrically connected to the electric power outputting terminal Vdc of the AC to DC power converting terminal 50, and the drain terminal is electrically connected to the third resistor R3.

The discharging circuit 70 accelerates discharging time of the capacitor C1, so that to prevent the voltage outputted from the electric power outputting terminal Vdc suddenly dropping causing by the capacitor C1 incomplete discharging when the electronic system is activated repeated in a short time.

Besides, the linear controlling module 7a further includes a protecting switch D electrically connected to the electric power outputting terminal Vdc of the AC to DC power converting module 50, the switching component Q2, and the capacitor C1. In this embodiment, the protecting switch D is, for example, a diode with anode and cathode. The anode of the protecting switch D is electrically connected to the power outputting terminal Vdc, and the cathode thereof is electrically connected to the switch component Q2 and the capacitor C1. When the electronic system PS is short, the electric outputting terminal Vdc outputs a heavy current. The protecting switch D makes the capacitor C1 discharge when the electronic system PS is short and the electric power outputting terminal Vdc outputs heavy current, namely the protecting diode D prevent the capacitor C1 from ineffectively discharging when electronic system PS is short. As the result, the voltage outputted from the electric power outputting terminal Vdc cannot drop while the short circuit situation of the electronic system PS is excluded and activated again.

The present invention also provides a controlling method of the switching component, and the controlling method can be applied to the linear controlling module shown in FIG. 4 or FIG. 5. The controlling method is applied to controlling switching component electrically connected to secondary of the AC to DC power converting module, and the secondary of the AC to DC power converting module includes the electric power outputting terminal, as shown in FIG. 3.

The switching component receives the electric power outputted from the electric power outputting terminal Vdc and decides whether or not to conduct the electric power to electronic system PS. When the electronic system PS is activate (in a non-standby mode), the switching component 54 conducts the electric power to the electronic system PS, while the electronic system PS is inactivate (in a standby mode), the switching component 54 cuts-off the electric power to conduct to the electronic system PS.

Figure 7:
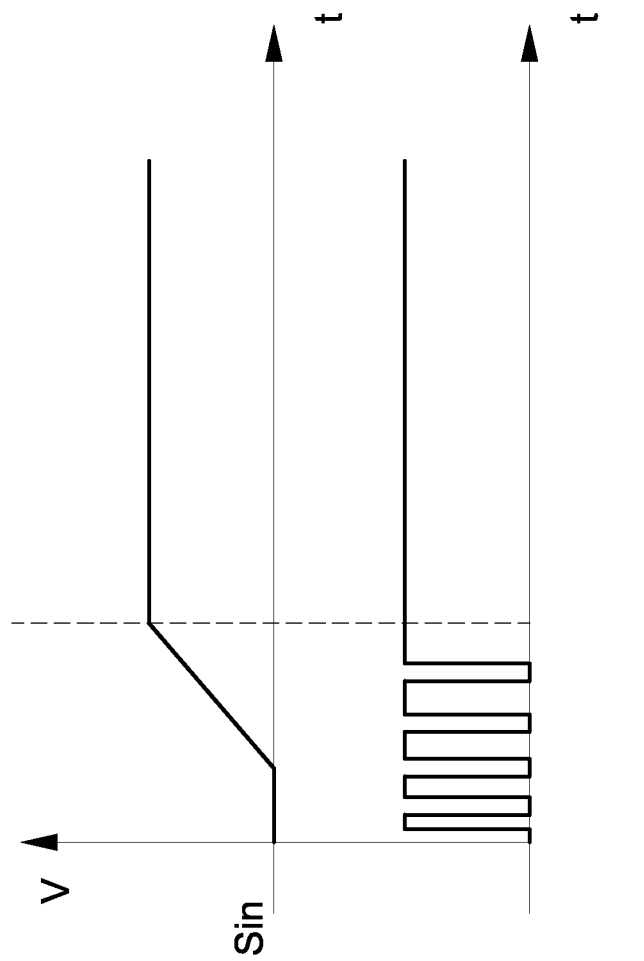
FIG. 7 is a waveform chart showing linear controlling signal.

The controlling method makes the switching component 54 conduct linearly and operates in a safe operation area to prevent the switching component 54 from over heat. The controlling method provides a driving voltage and a pulse width modulation (PWM) signals in sequence to the switching component 54 at first. After that, modulating the duty of the PWM signal from 0% to 100% as shown in FIG. 7, such that the driving voltage can linearly increase and drive the switching component to conduct linearly. In this embodiment, the time of duty cycle of the PWM signal modulated from 0% to 100% is 20 ms.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A linear controlling module for electrical connection with an electronic system and a power supplying device, the power supplying device having an electric power outputting terminal, a controlling signal outputting terminal, and a switching component electrically connected to the electric power outputting terminal, the linear controlling module comprising:
   a controlling switch electrically connected to the controlling signal outputting terminal;
   a first resistor electrically connected to the controlling switch;
   a capacitor electrically connected to the electric power outputting terminal and the first resistor;
   a second resistor electrically connected to the electric power outputting terminal, the switching component, the first resistor, and the capacitor; and
   a discharging circuit electrically connected to the electric power outputting terminal, the controlling signal outputting terminal, the capacitor, the first resistor, and the second resistor.

2. The linear controlling module in claim 1, wherein the discharging circuit comprises:
   a changing component electrically connected to the electric power outputting terminal and the controlling signal outputting terminal; and
   a third resistor electrically connected to the changing component, the first resistor, the capacitor, and the second resistor.

3. The linear controlling module in claim 2, wherein the changing component is a metal-oxide-semiconductor field-effect transistor.

4. The linear controlling module in claim 3, further comprising a protecting switch electrically connected to the electric power outputting terminal, the changing component, and the capacitor.

5. The linear controlling module in claim in claim 4, wherein the protecting switch is a diode.

6. A power supplying system electrically connected to an alternative current (AC) power supplier and an electronic system, the power supplying system comprising:
   an alternating current (AC) to direct current (DC) power converting module electrically connected to the AC power supplier and comprising an electric power outputting terminal;
   a switching component electrically connected to the electric power outputting terminal;
   a power manager electrically connected to the electronic system and the switching component, the power manager comprising a controlling signal outputting terminal;
   a controller electrically connected to the power manager and the AC to DC power converting module;
   a main power outputting terminal electrically connected to the switching component and the electronic system;
   a standby power outputting terminal electrically connected to the electric power outputting terminal and the electronic system; and
   a linear controlling module comprising:
   a controlling switch electrically connected to the controlling signal outputting terminal;
   a first resistor electrically connected to the controlling switch;
   a capacitor electrically connected to the electric power outputting terminal of the AC to DC power converting module and the first resistor;
   a second resistor electrically connected to the electric power outputting terminal of the AC to DC power converting module, the switching component, the first resistor, and the capacitor; and
   a discharge circuit electrically connected to the electric power outputting terminal of the AC to DC power converting module, the controlling signal outputting terminal, the capacitor, the first resistor, and the second resistor.

7. The power supplying system in claim 6, wherein the discharge circuit comprising:
   a changing component electrically connected to the electric power outputting terminal of the AC to DC power converting module and the controlling signal outputting terminal; and
   a third resistor electrically connected to the changing component, the first resistor, the capacitor, and the second resistor.

8. The power supplying system in claim 7, wherein the changing component is a metal-oxide-semiconductor field-effect transistor.

9. The power supplying system in claim 8, further comprising a protecting switch electrically connected to the electric power outputting terminal of the AC to DC power converting module, the changing component, and the capacitor.

10. The power supplying system in claim 9, wherein the protecting switch is a diode.

11. The power supplying system in claim 6, further comprising an isolating unit arranged between the power manager and the controller and electrically connected to the power manager and the controller.

12. The power supplying system in claim 6, wherein the AC to DC power converting module comprising:
- an electromagnetic interference filter electrically connected to the AC power supplier;
- a rectifier electrically connected to the electromagnetic interference filter; and
- a direct current (DC) to direct current (DC) power converter electrically connected to the rectifier, the DC to DC power converter comprising the electric power outputting terminal.

\* \* \* \* \*